(12) United States Patent
McCollough et al.

(10) Patent No.: US 6,229,400 B1
(45) Date of Patent: May 8, 2001

(54) METHOD AND APPARATUS FOR A CALIBRATED FREQUENCY MODULATION PHASE LOCKED LOOP

(75) Inventors: Kelvin E. McCollough; James John Caserta, both of Austin, TX (US)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/426,934

(22) Filed: Oct. 22, 1999

(51) Int. Cl.[7] .................................. H03D 3/09; H03L 7/08
(52) U.S. Cl. ................................ 331/17; 331/2; 331/25; 331/34; 332/127
(58) Field of Search .................... 331/2, 17, 34, 331/25; 332/127

(56) References Cited

U.S. PATENT DOCUMENTS

| | | | |
|---|---|---|---|
| 4,507,796 | * 3/1985 | Stumfall | 331/78 |
| 5,909,144 | * 6/1999 | Puckette et al. | 327/551 |
| 5,977,804 | * 11/1999 | Beech | 327/107 |

* cited by examiner

Primary Examiner—Siegfried H. Grimm
(74) Attorney, Agent, or Firm—James L. Clingan, Jr.

(57) ABSTRACT

In accordance with the present invention, a frequency modulating phase-locked-loop (FMPLL) (100) architecture is implemented. The frequency of the FMPLL (100) is controlled using a current controlled oscillator (ICO) (126). The ICO (126) receives a current signal incorporating feedback to maintain a fixed gain. The ICO (126) associated with the FMPLL (100) establishes a predictable change in the output frequency for a given change in its input controlled current (ICTL). Relying upon this fixed gain, a frequency shift can be created by summing in an additional delta current (IMOD) to the input control current. By periodically varying the magnitude of the current IMOD, a frequency modulated clock is produced at the output of the ICO 126. The magnitude of IMOD controls the amount of frequency shift of the frequency modulated clock. By providing an IMOD signal which is proportional to the generated system frequency, a frequency shift proportional to the average, or center, frequency is produced. Therefore, the percentage of frequency modulation is constant regardless of the magnitude of the system clock frequency. By calibrating the output reference of a voltage reference source 146, the desired modulation frequency percent can be further met.

16 Claims, 5 Drawing Sheets

METHOD AND APPARATUS FOR A CALIBRATED FREQUENCY MODULATION PHASE LOCKED LOOP

RELATED APPLICATIONS

A copending application has been concurrently filed titled "Method and Apparatus for a Frequency Modulation Phase Locked Loop", having application Ser. No. 09/425,881, now U.S. Pat. No. 6,160,861, and and assigned to the assignee hereof.

FIELD OF THE INVENTION

The present invention relates generally to Phase Locked Loops, and more specifically to a frequency modulating phase-locked-loop.

BACKGROUND OF THE INVENTION

Phase-locked-loops (PLLs) have been traditionally used in telecommunication products to generate and receive modulated signals. In addition, the use of phase-locked-loops has been extended to include advanced digital technologies. For example, microprocessors and microcontrollers commonly use phase-locked-loops to insure proper operation.

Phase locked loops can be used to provide a signal of fixed frequency. For modem digital components, these signals can be system clocks ranging in frequency from 10's to 100's of megahertz. It is well known that the use of devices having high frequency clocks generate electromagnetic interference (EMI). EMI is generated not only at the fixed clock rate, but also at the harmonics associated with the fixed clock rate. The resulting EMI can interfere with critical communication frequency transmission bands, including radio, television, and emergency broadcast channels. As a result of EMI, the received communication signals appear to be corrupted at the receiver end.

In order to assure operation of electronic devices does not compromise communication channels, the Federal Communications Commission, and its foreign counterparts, have mandated specific EMI transmission levels to which electronic systems are to be compliant.

One known method to reduce EMI transmission levels is the use of shielding applied at the system application level. For example, it is well known to use shielding in order to limit the EMI transmission in systems such as desktop computers. In addition, magnetic shielding devices have been applied to connector cables in order to filter EMI effects of transmitted signals. However, such system level EMI reducing techniques are not practical for all applications.

Another known technique to reduce the EMI effects of high frequency electronic components is to dither the frequency of the input clock. By dithering the clock frequency, the amount of peak energy EMI transmissions in a specific frequency band is reduced by spreading the peak energy over a larger bandwidth. While the total EMI energy remains unchanged, it is spread over a larger bandwidth, thereby reducing the effects of peak energy EMI at any specific frequency.

Clock dithering techniques in the prior art include the use of a dedicated PLL to generate a control voltage for a replica VCO which provides the clock output. The control voltage applied to the replica VCO reflects the control voltage necessary for generating a signal having a desired average frequency. For example, the desired output of the dedicated phase-locked-loop could be a control voltage capable of generating a 33 MHz signal. This control voltage, derived from the dedicated PLL to generate the desired average frequency, is provided to the replica voltage-controlled oscillator, which drives the system clock. In addition to the control voltage from the dedicated PLL, a periodically varying voltage signal, generally referred to as a modulating signal, is also provided to the replica VCO used to generate the system clock. By adding the received control voltage and the modulating signal, the replica VCO will produce a modulating, or dithered, clock output. For example, the 33 MHz clock may now be dithered by a range of +/−1 MHz. The amount of dithering selected is subject to the dynamic limitations of the electronics utilized.

The voltage-controlled oscillator associated with the dedicated phase-locked-loop is phase corrected by the voltage control signal previously described. Likewise, the voltage-controlled oscillator associated with the output driver portion of the prior art is also controlled by the previously described voltage control signal. However, any difference between the two voltage-controlled oscillators will result in a center frequency error on the output driver. This frequency error is not corrected by the phase-locked-loop. As a result, it is not possible to generate the desired centering frequency due to the uncompensated error associated with components of the output driver voltage-controlled oscillator. Secondly, the amount of frequency deviation achieved is not directly proportional to the center frequency due in part to the uncompensated error of the driver VCO and to the method of deriving the modulating signal.

Therefore, it would be desirable to identify a method and apparatus capable overcoming problems associated with the prior art FMPLLs.

DETAIL DESCRIPTION OF THE DRAWINGS

In accordance with the present invention, a frequency modulated phase-locked-loop (MPLL) architecture is implemented. The FMPLL is implemented using a current controlled oscillator (ICO). The ICO utilizes feedback to maintain a fixed gain. Therefore, for a given change in its input control current (ICTL), a predictable change in its output frequency results. Relying upon this fixed gain, a frequency shift can be created by summing in an additional delta current (IMOD) to the input control current. By periodically varying the magnitude of the current IMOD, a frequency modulated clock is produced at the output of the ICO. The magnitude of IMOD controls the amount of frequency shift of the frequency modulated clock. By providing an IMOD signal which is proportional to the generated system frequency, a frequency shift proportional to the average, or center, frequency is produced. The amount of frequency modulation is a constant percentage regardless of the magnitude of the system clock frequency within the defined operating range of the FMPLL as a system.

Figure 1:
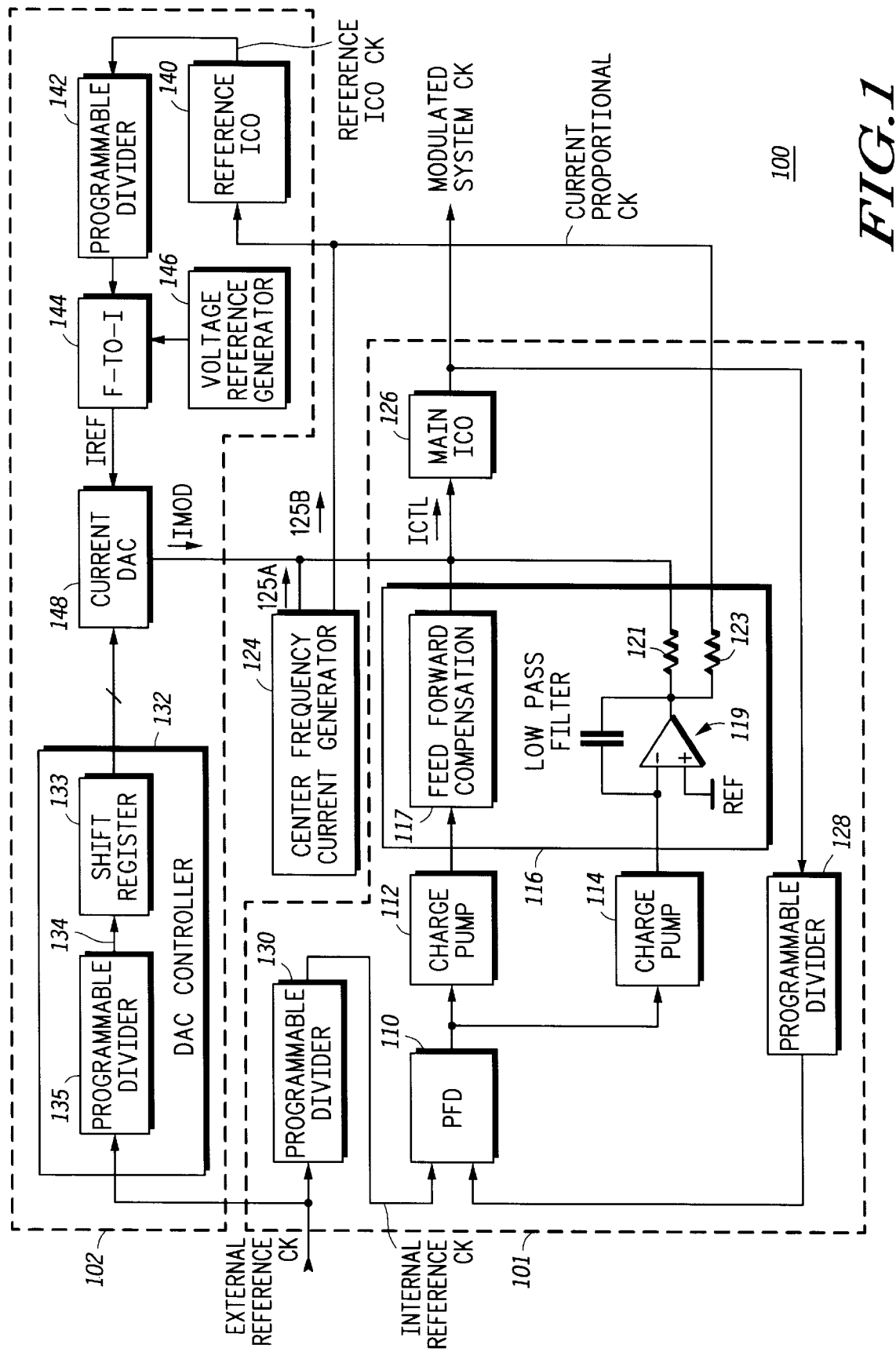
FIG. 1. illustrates, in block diagram form, a frequency generation system in accordance with the present invention.

FIG. 1 illustrates an FMPLL System 100. The System 100 includes a Main PLL Loop 101, a Reference Loop 102, and a center frequency current generator 124. In a specific embodiment of the present invention, the Main PLL Loop 101, and the Reference Loop 102 receive a clock labeled EXTERNAL REFERENCE CK having a predefined frequency. In addition, the Main PLL Loop 101 and the Reference Loop 102 each receive a current signal labeled 125A and 125B from the center frequency current generator 124. The Main PLL Loop 101 also receives a current modulation signal labeled IMOD from the Reference Loop 102.

In operation, the Main PLL Loop 101 is programmed to provide a fixed frequency value at the output labeled SYSTEM CK. In order to reduce the dynamic requirements of the Main PLL Loop 101, the centering frequency current 125A is provided from the center frequency current generator 124. One method of generating the centering clock frequency is disclosed in the copending application titled "Phase-Locked Loop", having application Ser. No. 09/425,880, and assigned to the assignee hereof, and is hereby incorporated by reference.

The Main PLL Loop 101 receives the modulation signal labeled IMOD to modulate the frequency of the SYSTEM CK by a predetermined amount. The modulation of the SYSTEM CK is such that the center frequency of the MODULATED SYSTEM CK generated by the Main PLL Loop 101 does not vary because of IMOD. There is an advantage in guaranteeing centering of the system frequency. By assuring a fixed center frequency, component yield and design reliability is improved.

FIG. 1 further illustrates a specific embodiment for the Main PLL Loop 101. The Main PLL loop O1 receives the EXTERNAL REFERENCE CK. The EXTERNAL REFERENCE CK is received by programmable divider 130, which is generally programmable and generates a signal labeled INTERNAL REFERENCE CK. The INTERNAL REFERENCE CK is received by the phase/frequency detector (PFD) 110. The PFD 110 provides a control signal based upon the INTERNAL REFERENCE CLOCK, and a second clock signal generated by dividing the system clock by aprogrammable divider 128. The output control signal from the PFD 110 supports two signal paths. The first path includes the charge pump 112 which receives the output control signal from the PFD 110 and provides a current output. The current output from the charge pump 112 is received by the Feed Forward Compensation Module 117 of the low pass filter 116. The feed forward compensation module 117 enables the Main PLL Loop 101 to phase lock during normal unmodulated frequency operation. The current provided by the feed forward compensation module 117 is included as part of ICTL, which is received by the main ICO 126.

The second signal path associated with the output of the PFD 110 includes charge pump 114, which also provides a current signal to the low pass filter 116. This current signal is received by the low pass filter 116 integrator 119, which comprises a differential amplifier configured in an AC unity gain topology. The signal generated by the charge pump 114 is received at the inverting input of the differential amplifier. The non-inverting input is connected to a reference source, while a capacitor 150 is connected between the output and inverting input of the amplifier. Typically, the reference source is chosen near mid-supply in order to be near the center of the dynamic range of the system. The voltage provided at the output of the integrator 119 has no substantial high frequency components, and thereby provides a stabilizing zero to the Main PLL Loop 101. When combined with resistor 123, the integrator 119 enables the Main PLL Loop 101 to lock onto the desired frequency.

Resistors 121 and 123 provide a current output from the integrator 119 to the main ICO 126 and Reference ICO 140 respectively. The current from resistor 121 is added to other currents to form ICTL. Generally, the summing of these currents to form ICTL occurs by connecting multiple current sources to a common node. It is noted that the currents generated by resistors 121 and 123 are proportional to the center frequency of the SYSTEM CLOCK, where the current through resistor 123 is a replication of the current generated through resistor 121, such that the replicated current is equal or proportional to the current through resistor 121.

The current generated by resistor 123 is labeled CURRENT PROPORTIONAL TO CK. The CURRENT PROPORTIONAL TO CK is added to the signal 125B and provided to the reference ICO 140 of the loop 102. Based upon the received current, the reference ICO 140 will substantially match the centered system clock frequency of the main ICO 126. However, when the Main PLL Loop 101 is frequency modulated, some residual components of the modulation of the system clock output will be present at the output of the reference ICO 140. In general, the effects of these components are attenuated to the degree whereby they are negligible and the frequency generated by the reference ICO 140 is substantially equal to the centered clock frequency. The reference ICO 140 output, labeled REFERENCE ICO CK, is provided to divider 142. The divider 142 provides a divided clock signal to the frequency to current converter 144. The frequency to current converter 144, in combination with the divider 142, and voltage reference generator 146, provide a current reference signal (IREF) to a current digital to analog converter (DAC) 148.

The frequency to current converter 144 can be implemented using a switched capacitor converter which receives a voltage reference value generated by the voltage reference generator 146, and a clock signal having a predetermined frequency (provided by the divider 142). As one of ordinary skill in the art will understand, by appropriately choosing the divider value 142, the reference voltage, and the capacitor values of the switch capacitor, the value of the current reference signal (IREF) provided to the current DAC 148 can be chosen. The value of IREF is based upon the amount of SYSTEM CK modulation desired.

The IREF signal is received by the current DAC 148, which provides a current output IMOD to the Main PLL loop 101. The current DAC 148 receives control signals from the DAC controller 132 to modulate IMOD. In a specific implementation, the DAC controller 132 comprises a programmable divider 135 which divides the EXTERNAL REFERENCE CK and provides a divider output to the shift register 133. The divided clock output from the divider 135 is labeled SHIFT CK in FIG. 2 (note that SHIFT CK is equivalent node 134 of FIG. 1). Based upon the configuration of the shift register 133, the current DAC 148 is controlled.

Figure 2:
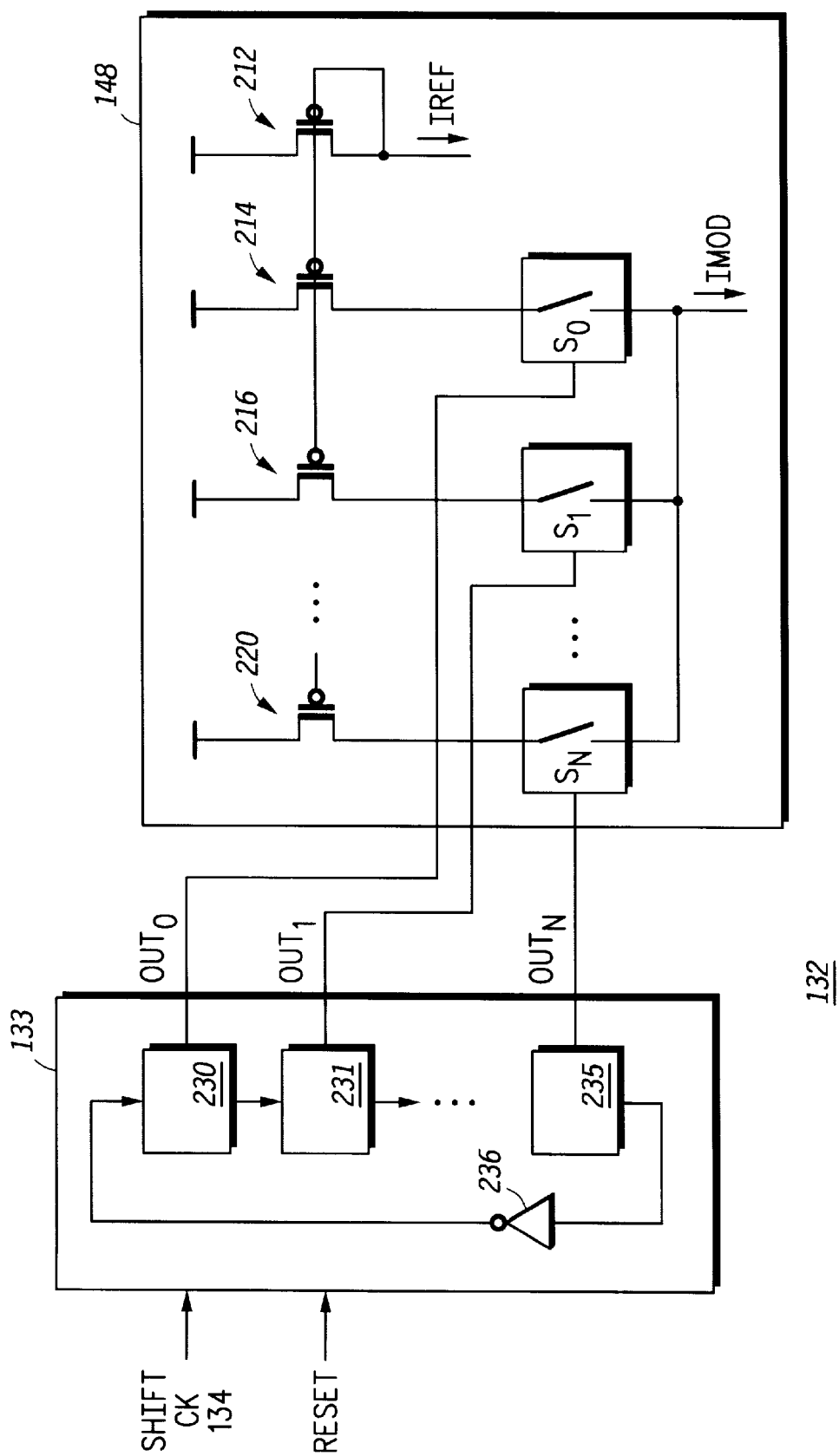
FIG. 2 illustrates, in block and circuit form, a portion of the frequency generation system of FIG. 1.

FIG. 2 illustrates a specific implementation of the shift register 133 and the DAC 148. In particular, the shift register 133 comprises N serially connected latches which are controlled by the signal SHIFT CK (N being an integer value). In addition, the shift register 133 is capable of being reset by asserting the signal labeled RESET. The output of the latch 235 is inverted by inverter 236, and fed back to the input of the latch 230.

In a specific embodiment of the current DAC 148, the reference current IREF is mirrored N times using transistors 212 through 220. The output of each individual current mirror is controlled by one of a switch S0 through SN, such that when an asserted signal is received by a switch, an amount current approximately equal to the value of IREF will flow through the switch. Each switch is connected to one of the outputs OUT0 through OUTN of the shift register 133. Each switch output is commonly connected to provide the modulation current IMOD.

During a reset operation the RESET signal is asserted, causing all outputs of shift register 133 to be negated. As a result, each of the DAC 148 switches are opened, resulting in IMOD having a current value of zero.

After reset, each SHIFT CK cycle will result in a shifting of the latched data in shift register 133. Since latch 230 receives an asserted signal after reset, OUT0 is asserted as a result of the first SHIFT CK cycle. OUT0 being asserted causes switch S0 of DAC 148 to be closed, allowing IMOD to be incremented by the amount of one current reference value (IREF).

Once all of the switches S0-SN have been closed, the process will be reversed, and each latch will be sequentially negated on successive clock cycles beginning with latch 230. As a result, a triangular shaped current modulation signal (IMOD) is generated and provided to the main ICO 126 of PLL 101. In response, the ICO 126 generates the MODULATED SYSTEM CK having a stable center frequency and frequency modulation based on IMOD. While the Main PLL 101 attempts to remove the frequency modulation component, the low-pass filter 116 prevents the frequency modulation component of the MODULATED SYSTEM CK from being removed.

When desirable to modulate the system clock by a precise percentage, such as 4% of the center frequency, it is possible to do so by choosing the appropriate value of IREF and the resolution of the DAC 148. For example, referring to FIG. 2, if N represents 40 to indicate 40 current mirror stages associated with the DAC 148, it is possible to choose an IREF value that is 1E-3 (1/1000) of the control current (ICTL) received by the main ICO 126 to obtain a 4% modulation swing. For example, if the control value received by the main ICO 126, without the modulation current, is 100 microamps, the values of the frequency to current converter 144, divider 142, and voltage reference generator 146 would be chosen such that IREF is approximately 0.1 microamps. In this manner, the value of IMOD, as generated by the DAC 148, will vary between 0 and 4 microamps (a 4% variation) By selecting the value of IREF in this manner, the percentage of modulation can be precisely controlled independent of the operating system clock frequency. By providing separate current sources from the low pass filter 116, the Reference ICO 140 provides a frequency generally fixed at the center frequency of the MODULATED SYSTEM CLOCK.

Figure 3:
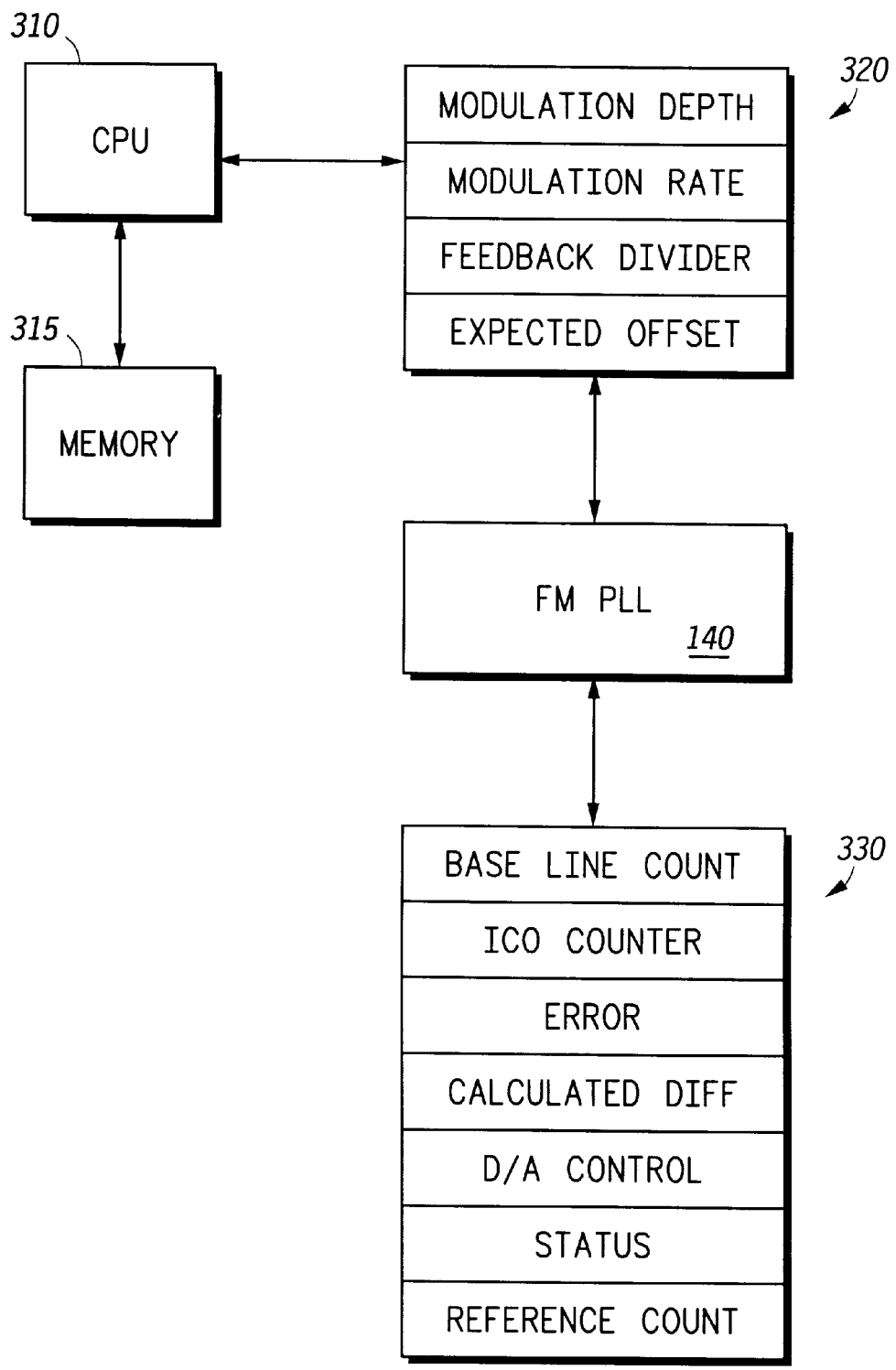
FIG. 3 illustrates, in block diagram form, a system view including register sets associated with the FMPLL of FIG. 1.

FIG. 3 illustrates a more detailed system view including the register sets associated with the FMPLL of FIG. 1. FIG. 3 illustrates a CPU processing module 310, a memory 315, register sets 320 and 330, and the FMPLL 140.

In operation, the register sets 320 and 330 receive and provide information to the FMPLL 140. In a specific embodiment, the register set 320 includes user programmable register locations, while register set 330 includes register locations written by the FMPLL 140.

Included within the register set 320 is a modulation depth register labeled MODULATION DEPTH, for indicating a desired percentage of frequency modulation (FM) variation. In a specific embodiment, the modulation depth register includes two bits that support four states. The four states include a disabled state, a 2% modulated state, a 4% modulated state, and a 6% modulation state. Note that additional and/or different states can be supported.

The modulation rate register of register set 320, labeled RATE MODULATION, specifies the actual rate at which the frequency modulates between a maximum and minimum frequency value. For example, in a +/-2% system, the rate at which the frequency varies between +2% of the center frequency and -2% the center frequency, and back again is the rate. By being able to specify the modulation rate, the effect on other blocks using the output clock can be controlled.

The feedback divider register of register set 320, labeled FEEDBACK DIVIDER, specifies a divide by value of programmable divider 128 of FIG. 1. In accordance with a specific embodiment of the present invention, programmable divider 128, and programmable divider 130 will be responsible for setting the baseline frequency (FO) of the system clock.

The expected offset register of register set 320, labeled EXPECTED OFFSET, stores a count value proportional to the desired modulation depth. In one embodiment, the expected offset register value is provided by the user. In an alternate embodiment, the value can be determined automatically by the system, however, in the embodiment described herein the value is provided by the user based upon tabular information.

Register 330 contains values generally provided by the voltage reference generator 146. The base line count register of register set 330, labeled BASE LINE COUNT, is for storing a count value C0 associated with an unmodulated system clock output. The ICO counter is utilized to count cycles of a modulated or unmodulated system clock output during a sampling period. The sampling period is defined by the system to be a predetermined number of reference cycles as discussed in greater detail herein.

The error value register of register set 330, labeled ERROR, is for storing the difference between the ICO counter and the base line counter.

The reference count register of register set 330, labeled REFERENCE COUNT, is for storing a value indicating the number of reference cycles elapsed since the last counter reset. When the value stored in the reference count register matches the predetermined number of reference cycles associated with a sample period, the ICO COUNTER value is held.

The calculated difference register of register set 330, labeled CALCULATED DIFF, is for storing the difference in counts between the error value register and the expected offset of register set 320.

The Digital-to-Analog (D/A) control register, labeled D/A CONTROL, is used to store a value used to control the output of a voltage Digital-to-Analog Converter (DAC) that affects the modulation of the system clock.

The status register of register set 330, labeled STATUS, is used to indicate one of a plurality of states, including when a calibration routine is completed, whether or not the calibration was successful, and other state information as may be necessary.

Figure 4:
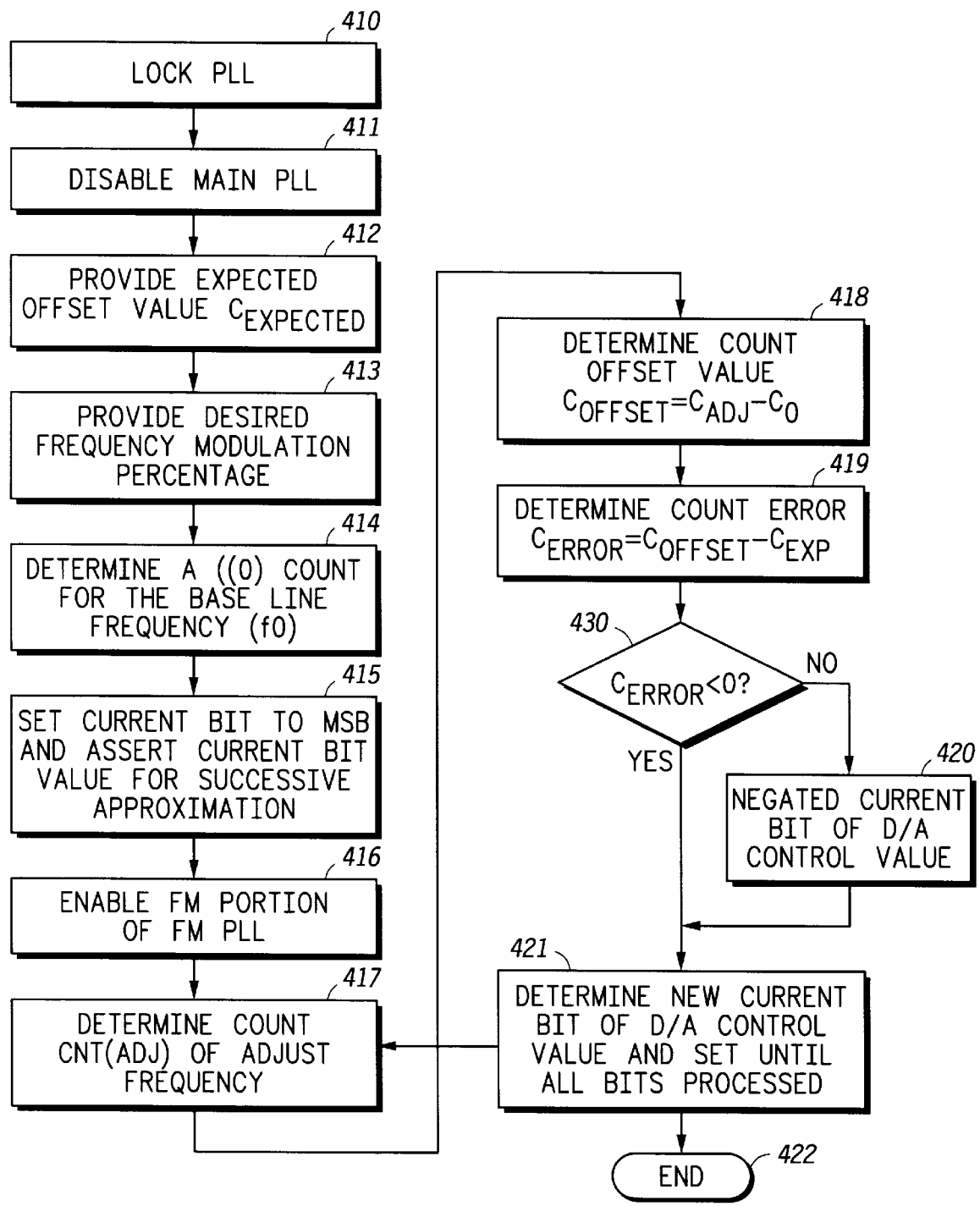
FIG. 4 illustrates, in flow diagram form, a method for calibrating a FMPLL in accordance with the present invention.

FIG. 4 illustrates, in flow diagram form, a method in accordance with the present invention for utilizing the voltage reference generator 146 of FIG. 1 to calibrate the frequency offset of the modulated system clock. For example, it may be desirable to have a modulated system clock with a frequency varying from +/−2% of the average system clock frequency. However, where a fixed value voltage reference generator is used, the actual modulation depth (frequency offset) can vary by a significant percentage. For example, for a desired depth of +/−2%, the actual depth may be +/−2.8% for a fixed reference. This represents a variation of 40% from the desired modulation. This variation is introduced by processing, temperature, and voltage variations. The method of FIG. 4 calibrates the selected frequency offset percentage to a specified value.

At step 410, the Main PLL Loop 101 of FIG. 1 is locked with frequency modulation disabled. The resulting frequency is referred to as the base line frequency.

At step 411, the Main PLL Loop 101 of FIG. 1 is disabled. In a specific embodiment, the loop is disabled by tri-stating charge pumps 112 and 114 of FIG. 1. Tri-stating the charge pumps allows the base line frequency to remain fixed. The term fixed is used to indicate the phase locked loop will no longer attempt to compensate for variations in the output frequency.

At step 412, an expected offset value is provided to the system. This expected offset value referred to as $C_{EXP}$ and is stored in the EXPECTED OFFSET register of register set 320 in the manner previously described.

At step 413, a desired frequency modulation percentage is provided. In a specific embodiment, the modulation percentage is provided by a user, however, it can be provided by some external control source in order to specify a desired modulation percentage. In a typical manner, the modulation percentage value is provided by writing a value to the MODULATION DEPTH register of register set 320.

In another embodiment, the steps 412 and 413 could be combined, such that for a specified frequency modulation depth percentage the expected offset value provided in step 412 is calculated. For example, for a desired ICO frequency of 40 MHz with an input clock frequency of 10 MHz, having an offset of plus or minus 2%, and a sample period of 200 reference clock cycles, the expected offset value will be determined by the equation:

$C_{EXP}$=ICO Frequency
  *number of references cycles/per sample period
  *percent offset/Reference frequency; or $C_{EXP}$=40 MHz*200*0.02/10 MHz=16.

In this manner the steps 412 and steps 413 are combined such that the expected offset is automatically calculated for a specified modulation percentage value given a known sample period. Note the above equations can be used to develop tables containing user programmable values.

At step 414, a base line count ($C_0$) is determined. Generally, the base line count will be determined by providing a sampling period consisting of a predetermined number of reference clock cycles. Generally, the actual number of reference clock cycles will be dependent upon the programmable divider 128 which provides feedback for the main loop.

At step 415, a current bit is defined to be the most significant bit of a register used for performing a successive approximation routine. In a specific embodiment, the current bit is asserted at the beginning of the successive approximation routine. Therefore, at the start of the successive approximation routine, the MSB would be asserted while all other bits would be negated.

At step 416, the Reference Loop 102 of FIG. 1 is enabled. The resulting magnitude of modulation is based on the D/A CONTROL register of register 330. The D/A CONTROL register value determines the voltage produced by the Voltage Reference Generator 146.

At step 417, an adjusted count ($C_{ADJ}$) is determined. The $C_{ADJ}$ is determined by counting of the number of cycles during the sample period after the Reference Loop 102 of FIG. 1 is enabled. Note that the $C_{ADJ}$ is the count of the base line plus the effects of the frequency modulation over the sample period. In effect, the count represents an integration of the frequency value over time.

At step 418, an offset count ($C_{OFFSET}$) is determined. The $C_{OFFSET}$ value is the $C_{ADJ}$ value less the base line count.

At step 419, an error count ($C_{ERROR}$) is determined based upon the $C_{OFFSET}$ less the $C_{EXP}$.

Because the $C_{OFFSET}$ represents the depth of either the maximum frequency or the minimum frequency from average frequency of the modulated system clock, and the $C_{EXP}$ represents the expected deviation from center, the $C_{ERROR}$ represents that amount by which the actual depth varies from the expected depth.

At step 430, a determination is made as to whether or not the $C_{ERROR}$ is less than zero. When the $C_{ERROR}$ is less than zero, the current bit, which is asserted previous to step 430, is correct and the flow proceeds to step 421. In the event the $C_{ERROR}$ is not less than zero, the flow proceeds to step 420.

At step 420, the current bit, which was asserted at step 415, is negated. The negation of the current bit at step 420 indicates that the current value stored within the D/A control register has a value higher than desired for calibration of the modulated system clock frequency. Conversely, when the $C_{ERROR}$ is less than zero, the value needed to be stored in the digital-to-analog control register used to control the voltage reference generator is a value larger than that presently stored within the register so the set bit is maintained. From step 420, the flow proceeds to step 421.

At step 421, in the event the least significant bit associated with the digital-to-analog control register has been processed, the successive approximation is completed and the flow would end at indicator 422. Otherwise, the next most significant bit is identified as the current bit. The newly identified current bit at step 421 is asserted, and the successive approximation routine continues at step 417.

In this manner, it is possible to successively approximate a register value for the digital-to-analog converter associated with the voltage reference generator 146, such that the desired percentage deviation from the base line frequency can be more closely guaranteed.

The method of FIG. 4 can be implemented in hardware and/or software. For example, the CPU 310 of FIG. 3 can access pre-programmed instructions stored within memory 315 in order to execute portions of the method of FIG. 4.

It will be understood by one skilled in the art that the CPU 310 could be replaced by a variety of other processing modules, including a single processing device or a plurality of processing devices. Such other processing devices may be a microprocessor, microcontroller, microcomputer, digital signal processor, state machine, logic circuitry, and/or any device that manipulates digital information based on operational instruction. The memory 315 may be a single memory device or a plurality of memory devices. Such a memory device may be read-only memory device, random access memory device, magnetic tape memory, floppy disk memory, hard drive memory, external tape, and/or any device that stores digital information. Note that when a processing module implements one or more of its functions via a state machine or logic circuitry, the memory storing the corresponding instructions is embedded within the circuitry comprised of a state machine and/or logic circuitry.

Figure 5:
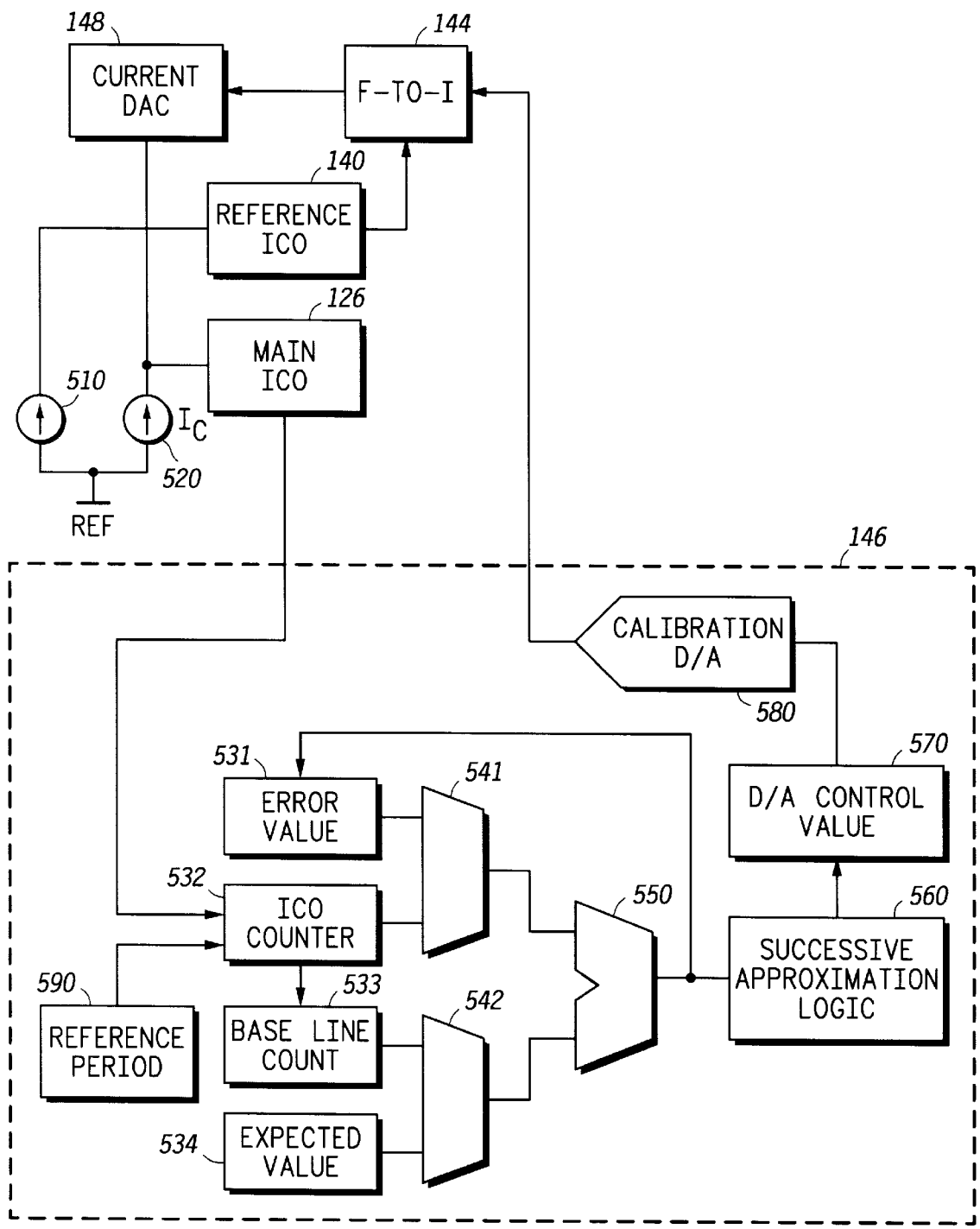
FIG. 5 illustrates, in block diagram form, a detailed view of a specific portion of the FMPLL.

FIG. 5 illustrates a hardware implementation capable of implementing the method of FIG. 4. FIG. 5 illustrates portions of the FM PLL of FIG. 1 including the current DAC 148, frequency to current converter 144, reference current controlled oscillator 140, and main current controlled oscillator 126. Current source 510 generally represents the differential amplifier 119, resistor 123, and current 125B which drive the Reference ICO 140. Current source 520 generally represents the differential amplifier 119, resistor 121, current 125A, and output of current DAC 148, IMOD of FIG. 1 which drive the main ICO 126. In addition, FIG. 5 illustrates a specific embodiment of the voltage reference generator 146.

The voltage reference generator 146 of FIG. 5 is illustrated to have register locations 531–534. Register location 531 is for storing the error value ($C_{ERROR}$), register location 532 is for storing the main ICO counter value ($C_{ADJ}$), register location 533 is for storing the base line count value ($C_0$), and register 534 is for storing the expected value ($C_{EXP}$). The values stored within registers 531–534 have been discussed previously with reference to FIG. 3 and FIG. 4.

A multiplexor 541 is connected to receive an input from the error value register 531, and the ICO counter register 532. Multiplexor 542 receives an input from the base line count register 533 and a second input from the expected value register 534. In addition, $C_0$ is loaded from the ICO count register 532 in step 414 of FIG. 4. A subtractor 550 is connected to the output of the multiplexor 541 and a second input is connected to the output of multiplexor 542. The output of the subtractor 550 is connected to a successive approximation logic block 560 and to the error value register 531.

The successive approximation logic portion 560 implements the successive approximation overhead steps, such as keeping track of the current bit, setting or clearing the current bit as appropriate, and enabling the multiplexors and registers to implement the flow of FIG. 4.

The output of the successive approximation logic block controls the actual value stored within the digital-to-analog control value register which is utilized by the calibration digital-to-analog converter 580. Based upon the value stored within the register 570, the calibration D/A 580 provides a voltage which is received by the frequency to current converter 144.

In operation, during steps 410–414 of FIG. 4, the ICO counter is controlled by the reference period block 590 such that the counter will increment only when the block 590 provides an asserted signal.

It should now be apparent to one of ordinary skill in the art, that by adding a modulating current reference to the signal received by the main ICO 126, a system clock frequency that remains centered is generated by the main ICO 126. In addition, by generating the modulating current reference based upon the centered frequency, the percentage of modulation can be precisely controlled. One of ordinary skill in the art will recognize that many variations of the specific implementation discussed can be implemented. For example, a voltage controlled implementation of the FMPLL can be implemented using techniques similar to those described, In addition, specific components can be modified, such as the DAC controller circuit 133 in conjunction with the DAC 148, which can comprise a variety of implementations, the controller 133 may be programmable, or may actually be a counter, and any number of low pass filters can be used. Furthermore, it should be apparent, that by allowing for calibration of the MODULATED SYSTEM CK, this present invention provides further advantages over the prior art by assuring even greater accuracy in supplying a modulated clock having a desired fixed percentage.

I claim:

1. A method comprising the steps of:

providing a phase locked loop within an integrated circuit having a control input for modulating a frequency of an output clock at an output of the phase locked loop;

receiving a value representative of the desired modulation depth into a first register; and providing an input signal having a first value to the control input;

measuring the modulation depth of the output clock in response to the first value;

loading a value representative of the measured modulation depth into a second register; and comparing the value in the first register to the value in the second register.

2. A method comprising the steps of:

providing a phase locked loop which provides an output clock with a modulation depth responsive to an input signal;

receiving a desired modulation depth value; and converting the desired modulation depth value to a magnitude of the input signal which provides the output clock with the desired modulation depth.

3. The method of claim 2, wherein the step of converting comprises:

applying the input signal at a first magnitude;

measuring the modulation depth value with the input signal having the first magnitude;

comparing the measured modulation depth value to the desired modulation depth value; and altering the magnitude of the input signal until the measured modulation depth value is within a predetermined resolution of the desired modulation depth value.

4. The method of claim 3, wherein the step of converting further comprises entering a digital value representative of the desired modulation depth into a first register.

5. The method of claim 4, wherein the step of comparing comprises:

entering a value representative of the measured modulation depth into a second register; and comparing the value associated with the first register to the value associated with the second register.

6. The method of claim 5, wherein the step of measuring the modulation depth comprises:

measuring a frequency of the output clock with no modulation;

measuring an average of the frequency of the output clock modulated in response to the input signal at the first magnitude; and obtaining the modulation depth by finding the difference between the average of the frequency of the modulated output clock and the frequency of the output clock with no modulation.

7. The method of claim 2, wherein the step of converting comprises:

applying the input signal at various magnitudes;

measuring the modulation depths with the input signal at the various magnitudes; and comparing the measured modulation depths with the desired modulation depth.

8. The method of claim 2, wherein the step of converting comprises:

entering a value representative of the desired modulation depth into a first register;

applying the input signal at a first magnitude;

measuring the modulation depth with the input signal at the first magnitude;

entering a value representative of the measured modulation depth into a second register; and comparing the value representative of the measured modulation depth to the value representative of the desired modulation depth.

9. A method comprising the steps of:

providing a phase locked loop within an integrated circuit having input for modulating a frequency of an output clock at an output of the phase locked loop;

loading a desired modulation depth of the output clock externally from the integrated circuit into a register within the integrated circuit; and successively approximating the modulation depth of the output clock in relation to the desired output modulation depth.

10. The method of claim 3 wherein the step of providing the input signal comprises the steps of:

generating a reference signal characterized as having a frequency; and generating the input signal in response to the reference signal.

11. An integrated circuit, comprising:

a phase locked loop which provides an output clock with a modulation depth responsive to an input signal;

a first register, coupled to an input for receiving signals external to the integrated circuit, which stores a value representative of a desired modulation depth, received from the input;

a second register which stores a measured modulation depth of the output clock; and a calibration circuit, coupled to the first register, the second register, and the phase locked loop, which ensures that the difference between the desired modulation depth and the measured modulation depth is less than a predetermined amount.

12. An integrated circuit, comprising:

a phase locked loop which provides an output clock with a modulation depth responsive to an input signal;

a first register, coupled to an input for receiving signals external to the integrated circuit, which stores a value representative of a desired modulation depth, received from the input;

a second register, coupled to the phase locked loop, which stores a measured modulation depth of the output clock; and a subtractor having a first input coupled to the first register and a second input coupled to the second register.

13. The integrated circuit of claim 12 further comprising a logic circuit having an input coupled to an output of the subtractor and an output coupled to the input of the phase locked loop.

14. The integrated circuit of claim 13, wherein the logic circuit comprises an approximation logic circuit.

15. An integrated circuit comprising:

a phase locked loop which provides an output clock with a modulation depth responsive to an input signal; and programming means for programming the phase locked loop to provide a modulation depth at a selectable level.

16. An integrated circuit comprising:

a phase locked loop which provides an output clock with a modulation depth responsive to an input signal; and storage means for receiving and storing a value representative of a selected modulation depth; and configuration means for providing the input signal at a magnitude which causes the phase locked loop to provide the output clock with the selected modulation depth.

* * * * *